(12) United States Patent
Jalali et al.

(10) Patent No.: US 7,450,790 B1
(45) Date of Patent: Nov. 11, 2008

(54) NON-ELECTRONIC RADIO FREQUENCY FRONT-END WITH IMMUNITY TO ELECTROMAGNETIC PULSE DAMAGE

(75) Inventors: Bahram Jalali, Los Angeles, CA (US); Chia-Jen Hsu, Los Angeles, CA (US); Bijan Houshmand, Pasadena, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/535,781

(22) Filed: Sep. 27, 2006

Related U.S. Application Data

(60) Provisional application No. 60/721,269, filed on Sep. 27, 2005.

(51) Int. Cl.
*G02B 6/00* (2006.01)
(52) U.S. Cl. ....................................................... 385/12
(58) Field of Classification Search .................... 385/12
See application file for complete search history.

(56) References Cited

U.S. PATENT DOCUMENTS

| | | | | |
|---|---|---|---|---|
| 5,488,677 | A * | 1/1996 | Tokano ............................ | 385/3 |
| 5,583,637 | A * | 12/1996 | Tokano et al. ................. | 356/477 |
| 7,209,613 | B2 * | 4/2007 | Liang et al. ................... | 385/100 |
| 7,239,392 | B2 * | 7/2007 | Chism, II ....................... | 356/369 |
| 2003/0052258 | A1 * | 3/2003 | Russell et al. ............ | 250/227.17 |

OTHER PUBLICATIONS

C.H. Bulmer. Sensitive, highly linear lithium niobate interferometric waveguide modulator for electromagnetic field sensing, Appl. Phys. Lett., 1988, pp. 2368-2370, vol. 53.

R. Dettmer. Dielectric antennas make waves. IEE Review, Feb. 2003, pp. 28-31, vol. 49, No. 2.

M. Hossein-Zadeh et al. 14.6 GHz LiNbO3 microdisk photonic self-homodyne RF Receiver. IEEE Trans. Microwave Theory and Tech., Feb. 2006, pp. 821-831, vol. 54, No. 2.

M. Hossein-Zadeh et al. Self-homodyne RF-optical LiNbO3 microdisk receiver. Solid-State Electronics, 2005, pp. 1428-1434, vol. 49.

V.S. Ilchenko et al. Sub-micro watt photonic microwave receiver. IEEE Photon. Technol. Lett., Nov. 2002, pp. 1602-1604, vol. 14, No. 11.

(Continued)

*Primary Examiner*—Ellen Kim
(74) *Attorney, Agent, or Firm*—John P. O'Banion

(57) ABSTRACT

A non-electronic all-dielectric (NEAD) or non-electronic RF (NERF) front-end that exploits isolation features of photonics to eliminate metal electrodes, interconnects and the antenna. An electro-optic (EO) modulator is integrated with a dielectric resonance antenna to exploit unique isolation features of photonics. A doubly (RF and optical) resonant device design maximizes the receiver sensitivity. High-Q optical disk resonators and dielectric resonant antennas are integrated to create an efficient mixing of light and RF fields. The resulting non-electronic RF technology produces an all-dielectric RF front-end which provides complete isolation between the air interface and the ensuing electronic circuitry, enabling the creation of an RF receiver that is immune to high-power electro-magnetic pulses (EMP) and High Power Microwave (HPM) pulses. The device can also be configured as a non-intrusive field probe that co-exists with a conventional receiver and detects a EMP or HPM attack.

34 Claims, 12 Drawing Sheets

OTHER PUBLICATIONS

S.A. Long et al. The resonant cylindrical dielectric cavity antenna. IEEE Trans. Antennas Propagat., May 1983, pp. 406-412, vol. 31.

R. Mongia et al. Dielectric resonator antennas, a review and general design relations for resonant frequency and bandwidth. J. Microwave Millimeter-Wave Computer-Aided Eng., 1994, pp. 230-247 vol, 4, No. 3.

T. Nagatsuma. Measurement of high-speed devices and integrated circuits using electro-optic sampling technique. IEICE Trans. Electron., 1993, pp. 55-63, vol. E76-C, No. 1.

D.H. Naghski et al. An integrated photonic Mach-Zehnder interferometer with no electrodes for sensing electric fields. IEEE J. Lightwave Technol., Jun. 1994, pp. 1092-1098, vol. 12. No. 6.

A. Petosa et al. Recent advances in dielectric resonator antenna technology. IEEE Trans. Antennas Propagat., Jun. 1998, pp. 235-248, vol. 40.

J.A. Valdmanis et al. Subpicosecond electrooptic sampling: Principles and Applications. IEEE J. Quan. Electron., Jan. 1986, pp. 69-78, vol. 22, No. 1.

\* cited by examiner

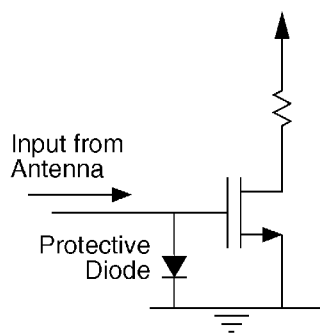
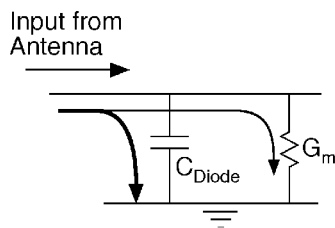
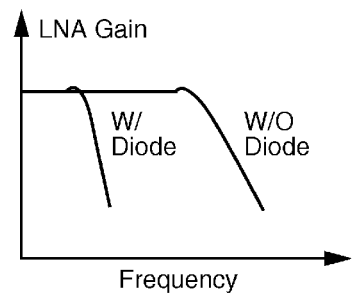
FIG. 1A
(Prior Art)
FIG. 1B
(Prior Art)
FIG. 1C
(Prior Art)

NON-ELECTRONIC RADIO FREQUENCY FRONT-END WITH IMMUNITY TO ELECTROMAGNETIC PULSE DAMAGE

CROSS-REFERENCE TO RELATED APPLICATIONS

This application claims priority from U.S. patent application Ser. No. 60/721,269 filed on Sep. 27, 2005, incorporated herein by reference in its entirety.

STATEMENT REGARDING FEDERALLY SPONSORED RESEARCH OR DEVELOPMENT

This invention was made with Government support under Grant No. FA8750-05-1-0101 (AFRL) awarded by the Defense Advanced Research Projects Agency (DARPA). The Government has certain rights in this invention.

INCORPORATION-BY-REFERENCE OF MATERIAL SUBMITTED ON A COMPACT DISC

Not Applicable

BACKGROUND OF THE INVENTION

1. Field of Invention

This invention pertains generally to protecting electronic equipment from electromagnetic pulses, and more particularly to a radio frequency (RF) front end designed for immunity to electromagnetic pulses.

2. Description of Related Art

The Graham Commission report, made to U.S. Congress' House Armed Services Committee on Jul. 22, 2004, concluded that a "high-altitude nuclear electromagnetic pulse" is one of the few threats that can hold at risk the continued existence of civil society in the United States. Directed Energy (DE) weapons, including high power Electro-Magnetic Pulse (EMP) weapons and High Power Microwave (HPM) weapons, generate intense pulses of electromagnetic waves that could damage or destroy sensitive electronic circuits. The danger is exacerbated by the fact that the trend towards reduced geometry and voltage renders modern electronics more susceptible to damage from sources of high-power spurious EM radiation, including microwave weapons or nuclear radiation. As an example, a voltage of mere ten volts can punch through the gate of a modern MOS transistor, while voltage of tens of kilovolts or larger can be readily generated by EMP or HPM weapons.

The most vulnerable devices are high density CMOS digital circuits and radio frequency electronics hardware, and, in particular, low noise amplifiers (LNA) of an RF receiver. To meet the stringent speed and noise requirements, these circuits typically use highly scaled transistors with low breakdown voltage. While most components in a system can be protected using Faraday cages, the front-end components are particularly vulnerable, because the antenna provides a direct path for high voltage surge to enter the system. In addition, parasitic or stray capacitances couple energy into circuits providing additional concerns.

Because of the low level of received signal, the receiver circuit is most sensitive to damage from instantaneous voltage surges. Furthermore, while conventional electrostatic discharge (ESD) protection schemes may be able to protect low frequency circuits, presently there are no means to protect high frequency circuits, including wireless and radar front end electronics, from EMP or HPM attacks. For example, the traditional ESD protection approach of using a shunt diode is not applicable at high RF frequencies, since the additional capacitance of the diode will compromise the bandwidth and noise performance of the receiver as illustrated for the low noise amplifier (LNA) front end circuit in FIG. 1.

For directed energy test and evaluation (DE T&E) purposes, sensors are needed to measure electrical fields at high sample rates and wide dynamic range within EMP or HPM beams. In addition, the sensors should be non-interfering, non-intrusive, survivable, and small enough to mount inside targets with limited space. Photonic techniques using optical carriers to interact with electromagnetic fields provide a unique isolation feature between the air interface and the ensuing electronics.

It will also be appreciated that electro-optic probing systems using Pockels effect have been widely demonstrated (see, for example, C. H. Bulmer, "Sensitive, highly linear lithium niobate interferometric waveguide modulator for electromagnetic field sensing," Appl. Phys. Lett., vol. 53, pp. 2368-2370, 1988, incorporated herein by reference in its entirety, and D. H. Naghski, J. T. Boyd, H. E. Jackson, S. Sriram, S. A. Kingsley, and J. Latess, "An Integrated Photonic Mach-Zehnder Interferometer with No Electrodes for Sensing Electric Fields," IEEE J. Lightwave Technol., vol. 12, no. 6, June 1994, also incorporated herein by reference in its entirety) and could be considered as a potential solution. However, metals are used as electrodes for the electro-optic modulator or as the transmission line linking a metal antenna to the modulator, and the presence of metal causes two problems. First, metal electrodes and transmission lines can be severely damaged or destroyed in EMP and HPM attacks. Second, in an application as a field probe, these probes must be non-intrusive. This means that they should not effect a significant change in the field pattern when placed in front of, or adjacent to a conventional receiver. For example, non-intrusive survivable sensors are needed to measure high amplitude fields inside a target set (e.g., a missile airframe or a computer system) without altering the EM field inside the structure as if the probe had never been there. Ideally, a problem should be able to capture the entire bandwidth and different polarizations of the field, and be able to withstand extreme power densities ranging from approximately 1000 $W/cm^2$ to 10,000 $W/cm^2$.

Another problem with prior approaches, and one that is particularly onerous when it is used in receivers, is the inherent low sensitivity.

BRIEF SUMMARY OF THE INVENTION

The foregoing problems are addressed by the present invention, which generally comprises a Non-Electronic All-Dielectric (NEAD) or Non-Electronic RF Front End (NERF) technology that exploits isolation features of photonics. The advantages of using photonic techniques for electromagnetic field sensing measurement have been recognized for many years. The theory of electro-optic (EO) modulation is discussed in detail in "Optical Waves in Crystals" by Amnon Yariv and Pochi Yeh. In most electro-optic (EO) probing applications, one takes advantage of the "Pockels Effect" as the electric field-induced variation of the refractive index modulates the amplitude or the phase of the optical carrier. The modulated optical signal is then converted back to electronic signal by using a photodetector. The use of optical carriers provides intrinsic electromagnetic isolation between the incoming field and the electronic instrumentation connected after the photodetector, making this technique a promising candidate for creating a survivable HPM sensor.

One aspect of the invention is to eliminate metal electrodes, interconnects and the metal antenna found in conventional equipment. Another aspect of the invention is the use of a dielectric resonance antenna that behaves as a "concentrator" for the received RF power. For example, in one embodiment, an EO modulator is integrated with a dielectric resonance antenna to exploit unique isolation features of photonics. According to another aspect of the invention, doubly (RF and optical) resonant device design maximizes the receiver sensitivity.

Another aspect of the invention is the integration of high-Q optical EO resonators and dielectric resonant antennas to create an efficient mixing of light and microwave fields. The resulting Non-Electronic RF (NERF) technology brings about a Non-Electronic all-dielectric (NEAD) RF front-end, which provides complete isolation between the air interface and the ensuing electronic circuitry, thereby creating a wireless receiver front end that is immune to directed energy attacks.

In one embodiment, the invention is configured as an RF receiver front-end that replaces a conventional receiver front-end (hereafter called "receiver" application). In another embodiment, the invention is configured as a non-intrusive field probe (hereafter called "field probe" application") that co-exists with a conventional receiver and detects a directed energy attack. There is a particular need for such a non-intrusive field probe, since in many instances a directed energy attack does not cause immediate destruction of the conventional receiver and therefore goes undetected. However, because the receiver circuitry is nevertheless damaged, the receiver can fail at a later and unpredictable time that can be during a critical mission.

Another aspect of the invention is combining a dielectric resonance antenna with an electro-optic field sensor. In one beneficial embodiment, this combination is used to create an RF receiver front end without the use of a metal antenna or metal interconnects. In another beneficial embodiment, this combination is used to create an RF receiver front end that contains no electronic components or circuitry after the antenna. In another beneficial embodiment, the technology is used as an EMP and HPM immune field probe. In another beneficial embodiment, the technology is used as a remote RF sensor. Another aspect of the invention is use of RF to optical conversion to effect electrical isolation between receiver electronics and the air interface.

Another aspect of the invention is use of a dielectric resonance antenna to reduce the radar cross section and hence to improve stealth performance of an RF receiver.

Another aspect of the invention is use a high permittivity material for reducing the antenna aperture size for applications related to EMP and HPM immune receivers.

A still further aspect of the invention is a method for forming a network of said receivers by multiplexing multiple devices using optical wavelength division multiplexing (WDM).

Another aspect of the invention is the use of reverse poling of the EO resonator to break its symmetry and to maximize the RF to optical conversion efficiency.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL
VIEWS OF THE DRAWING(S)

The invention will be more fully understood by reference to the following drawings which are for illustrative purposes only:

FIG. 1 illustrates the response of a conventional Low Noise Amplifier (LNA) to electromagnetic pulses: (a) simplified circuit diagram for a Low Noise Amplifier (LNA) showing the high voltage protection diode at the input node; (b) equivalent circuit model showing the capacitive loading of the input node; (c) the impact on the frequency response.

DETAILED DESCRIPTION OF THE INVENTION

1. Front End Architecture: Electro-Optic Isolation

Figure 2:
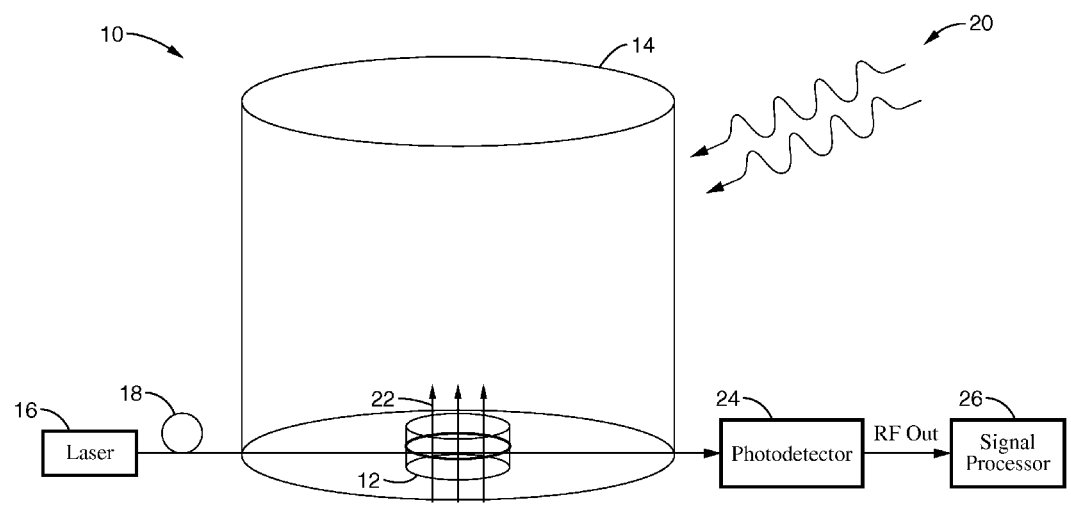
FIG. 2 is a functional block diagram of a non-electronic all dielectric (NEAD) radio frequency (RF) sensor comprising a dielectric resonance antenna with an integrated electro-optic resonator according to an embodiment of the present invention.

Referring first to FIG. 2, the architecture of the Non-Electronic RF Front End (NERF) technology of the present invention is illustrated. It will be appreciated from the discussion that follows that the technology can be employed in a radio frequency receiver, a field probe, or a remote RF sensor, and other applications where isolation between the input signal and downstream electronics is required or desirable.

By way of example, and not of limitation, the invention employs a probe head 10 that provides isolation between the air interface and downstream electronic circuitry. In the embodiments illustrated herein, probe head 10 comprises an electro-optic (EO) resonator 12 integrated with a dielectric resonance antenna (DRA) 14. Light from a laser 16 is launched into an optical fiber 18 that serves as an optical signal carrier. The preferred laser source is a narrow linewidth linearly polarized monochromatic laser which operates at a wavelength of approximately 1.55 microns. The DRA 14 detects the incoming EM wave (signal) 20 and builds up an efficient resonant electric field 22 that modulates the nearby EO resonator through Pockels effect, creating intensity modulation on the optical carrier. The modulated light is then coupled to a high-speed photodetector 24 and is converted back to an electrical form suitable for signal processing.

Beneficially, the present invention allows for the entire front end to be made of only dielectric materials (free of any conducting metal such of metal antenna or metal interconnects/electrodes). This all-dielectric nature of the front end significantly increases the damage threshold when attacked by Electro-Magnetic Pulse (EMP) or High Power Microwave (HPM) weapons (HPM), and using an EO sensing technique to pick up the electrical signal provides a unique form of charge isolation which prevents EMP or HPM weapons from threatening any electronic system placed after the photodetector.

As can be seen from the foregoing, the invention is based on the use of an EO resonator modulator integrated with a dielectric resonance antenna. In addition, those two elements form an innovative doubly resonant device in which RF and optical signals are in simultaneous resonance. The RF resonance is created by a Dielectric Resonance Antenna (DRA) and the optical resonance is sustained in a high-Q optical resonator made from a nonlinear optical crystal as will be discussed in detail in the following sections.

2. Optical Resonance: High-Q Optical Resonator

Figure 3:
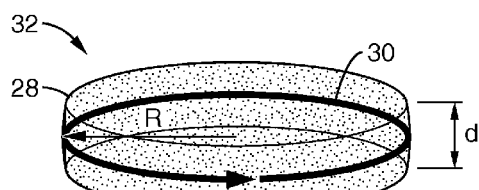
FIG. 3 is a schematic perspective view of a microdisk resonator supporting WGM propagation according to an embodiment of the present invention.
Figure 4:
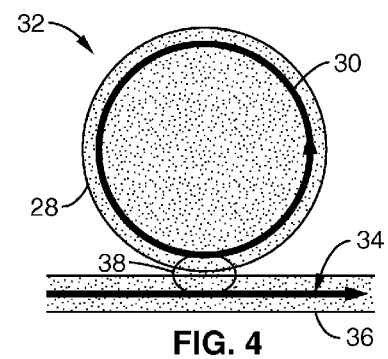
FIG. 4 is a schematic plan view of the microdisk resonator shown in FIG. 3.
Figure 5:
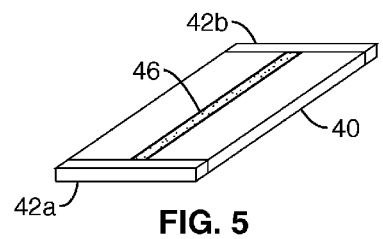
FIG. 5 is a schematic perspective view of a Fabry-Perot type resonator according to an embodiment of the present invention.
Figure 6:
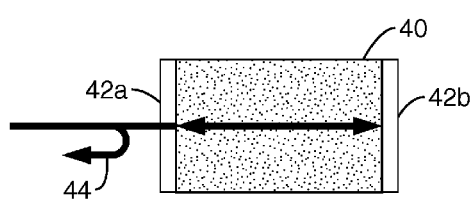
FIG. 6 is a schematic plan view of the resonator shown in FIG. 5.

Referring to FIG. 3 through FIG. 6, two preferred embodiments of the inventive EO sensor are illustrated that use resonators made from a material showing strong Pockels effect, such as lithium niobate ($LiNbO_3$) and lithium tantalite ($LiTiO_3$). FIG. 3 and FIG. 4 illustrate a microdisk resonator and FIG. 5 and FIG. 6 illustrate a Fabry-Perot (F-P) type resonator.

Figure 7:
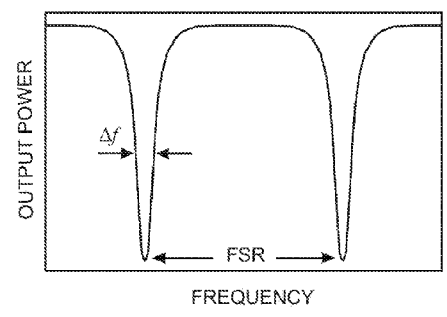
FIG. 7 illustrates the typical output spectrum of both the microdisk resonator shown in FIG. 3 and FIG. 4 and the F-P resonator shown in FIG. 5 and FIG. 6.

In the microdisk resonator 28, optical resonance is achieved by confining a linearly polarized optical field 30 in a high-Q whisper-gallery mode (WGM) along the periphery 32 of the disk resonator. The output light 34 is then evanescently coupled to an output fiber 36 using an optic coupling means 38 as will be described in more detail below. In a Fabry-Perot resonator 40, the resonance is simply sustained by the two reflecting end mirrors 42a, 42b, and the output light 44 is extracted at an end of the resonator. As illustrated in FIG. 7, the output spectrum of these high-Q resonators in frequency domain is a series of Lorentzian line-shapes, centered at the resonance frequencies of the disk. Adjacent resonance notches are separated by one free spectral range (FSR), which is equal to c/2nL, where n is the refractive index of the resonator material and L is the length of a single round trip in microdisk or F-P resonator.

Note that photons will make a number of round-trips in these high-Q optical resonators. Therefore when a modulating field is applied to the resonator, the photons interact with the field on multiple passes which increase the total phase shift accumulated. When the laser frequency ($f_0$) is biased at the slope of the resonance notch, the modulating field can result in direct intensity modulation on the optical carrier. This is because the modulating field effectively changes the refractive index and shifts the resonance spectrum in the frequency domain. Since the laser is biased at a specific frequency on the resonance slope, shifting the resonance spectrum results in intensity modulation. In these configurations, even a small voltage applied across the area of confinement is enough to induce a change in the resonance frequency with a magnitude compared to its bandwidth. This forms the basis for efficient modulation.

3. Fabrication of the EO Resonator

Referring to FIG. 3 and FIG. 4, in order to achieve the high-Q WGM resonance required in the present invention, the sidewall of the microdisk resonator should be shaped into a curved contour with an optical grade finish. This requires more sophisticated optical polishing procedures to ensure the concentricity and surface quality of the disk. This can be easily achieved, for example, by polishing a z-cut lithium niobate (LN) disk-shaped resonator. The resonator illustrated in FIG. 3 is a curved sidewall disk with radius R=1.8 mm and thickness d=300 micron, and expected to have an optical Q in excess of $10^6$.

Referring to FIG. 5, the F-P EO resonator based on lithium niobate can be fabricated on a waveguide structure (see, for example, T. Suzuki, J. M. Marx, V. P. Swenson, and O. Eknoyan, "Optical waveguide Fabry-Perot modulators in $LiNbO_3$," Applied Optics, Volume 33, Issue 6, pp. 1044-1046, Feb. 20, 1994). For example, a cavity waveguide 46 can be produced by Ti diffusion on a lithium niobate substrate. To form a F-P waveguide cavity, the two end faces need to be polished and coated with dielectric mirrors 42a, 42b.

4. Efficient Coupling of Laser Light into the Optical Resonator

Note that optical WGM cannot be excited directly by simple propagating beams. Accordingly, in an embodiment of the present invention coupling is achieved through indirect excitation of WGM using evanescent fields (evanescent coupling). There are numerous methods for evanescent coupling of light into disk resonators. However, prism coupling is particularly convenient when dealing with resonators that are made of high refractive index material such as lithium niobate.

Figures 8, 9:
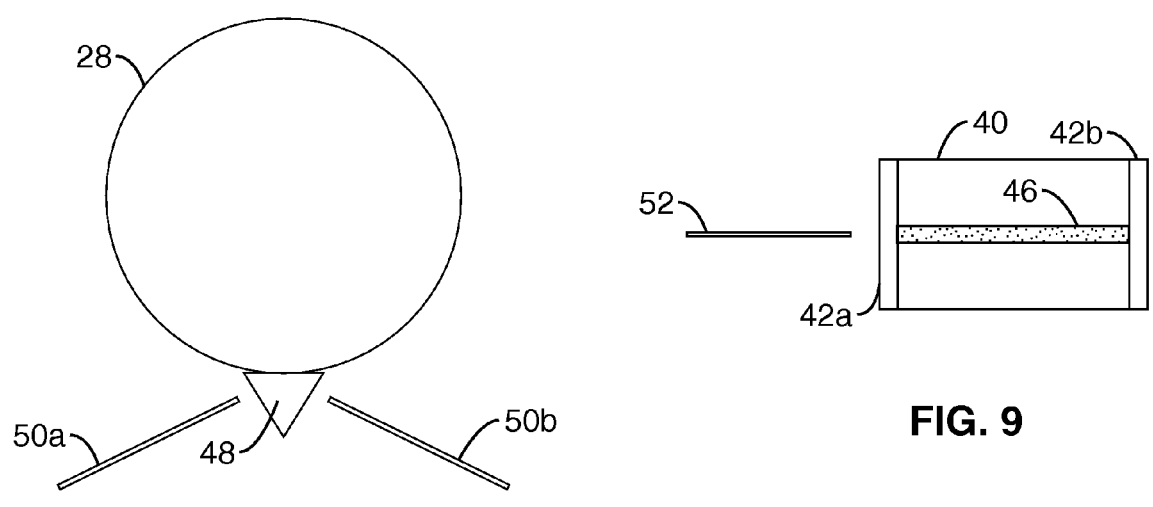
FIG. 8 is a schematic plan view illustrating optical coupling to the microdisk resonator shown in FIG. 3 and FIG. 4 according to an embodiment of the invention.
FIG. 9 is a schematic plan view illustrating optical coupling to the Fabry-Perot resonator shown in FIG. 5 and FIG. 6 according to an embodiment of the present invention.

FIG. 8 illustrates an embodiment of a microdisk resonator using prism coupling. In the embodiment shown, a prism 48 couples the light from an input lensed collimating fiber 50a into EO resonator 28 and also couples the light out of the EO resonator into output lensed collimating fiber 50b. The alignment of the EO resonator 28 with respect to the prism 48 and lensed collimating fibers 50a, 50b is extremely important in the present invention. Therefore, with the prism 48 in contact with the resonator 28, optical alignment is preferably performed by actively determining the correct position of the input and output fibers 50a, 50b with respect to the prism 48. FIG. 9 illustrates an embodiment of a Fabry-Perot waveguide resonator using a collimated lensed fiber 52 to couple light into the resonator. As illustrated in FIG. 6, the output light is sampled along the same path. In one embodiment active alignment is performed on the optical sub-assembly (for microdisk: EO resonator+prism+input/output fibers, for F-P: EO resonator+fiber) before they are integrated with the DRA. The entire optical sub-assembly will then be placed inside or in the vicinity of DRA as will be described below. Active alignment is a standard manufacturing technique that is used in packaging of single mode laser transmitters that are the basic building block of long haul and metropolitan telecommunication networks.

5. RF Modulation

Unlike conventional Mach-Zehnder traveling-wave devices which are bandwidth limited by the phase velocity mismatch between the electrical and optical waves over the active length of the device, a resonance type modulator described herein has sufficiently small dimensions that it can be considered a lumped device. Most importantly, these resonance type devices are not limited to operation at low RF frequencies. With proper design of the RF E-field pattern applied on the disk resonator, it is possible to obtain a modulation response at high RF frequencies up to tens of GHz. This high frequency modulation is achieved when the laser frequency is biased at the slope of the optical resonance and the modulation sideband at the adjacent optical resonance modes which is one FSR away in the frequency domain. In other words, the modulation frequency ($f_m$) is exactly equal to the optical FSR.

However, the modulating E-field ($E_m$) applied to the resonator should not be uniform along the resonator cavity; otherwise no sideband will be generated at $f_0+f_m$ and $f_0-f_m$. This can be explained by examining the modulated optical phase after a single roundtrip (refer to, for example, A. Yariv, Optical Electronics in Modern Communications, New York, Oxford University Press, 1997, pages 356 to 366, incorporated herein by reference in its entirety), which is given by $$\phi(\omega_m) = \delta\sin(\omega_m t - \theta), \quad \text{where} \quad \delta = \frac{\pi n^3 r_{33} E_m L}{\lambda} \text{sinc}\left(\frac{\omega_m n L}{2c}\right).$$

Here L is the roundtrip length and $\omega_m$ is the RF angular frequency=$2\pi f_m$. It is apparent that when $f_m$=FSR=c/2nL, the modulated phase shift becomes zero. In other words, the optical wave propagation time spent in phase with the positive and negative portions of the RF waves offset each other, resulting in no net modulation at all. To prevent this from happening, the modulation field should not be uniformly applied to the EO resonator cavity.

Figure 10:
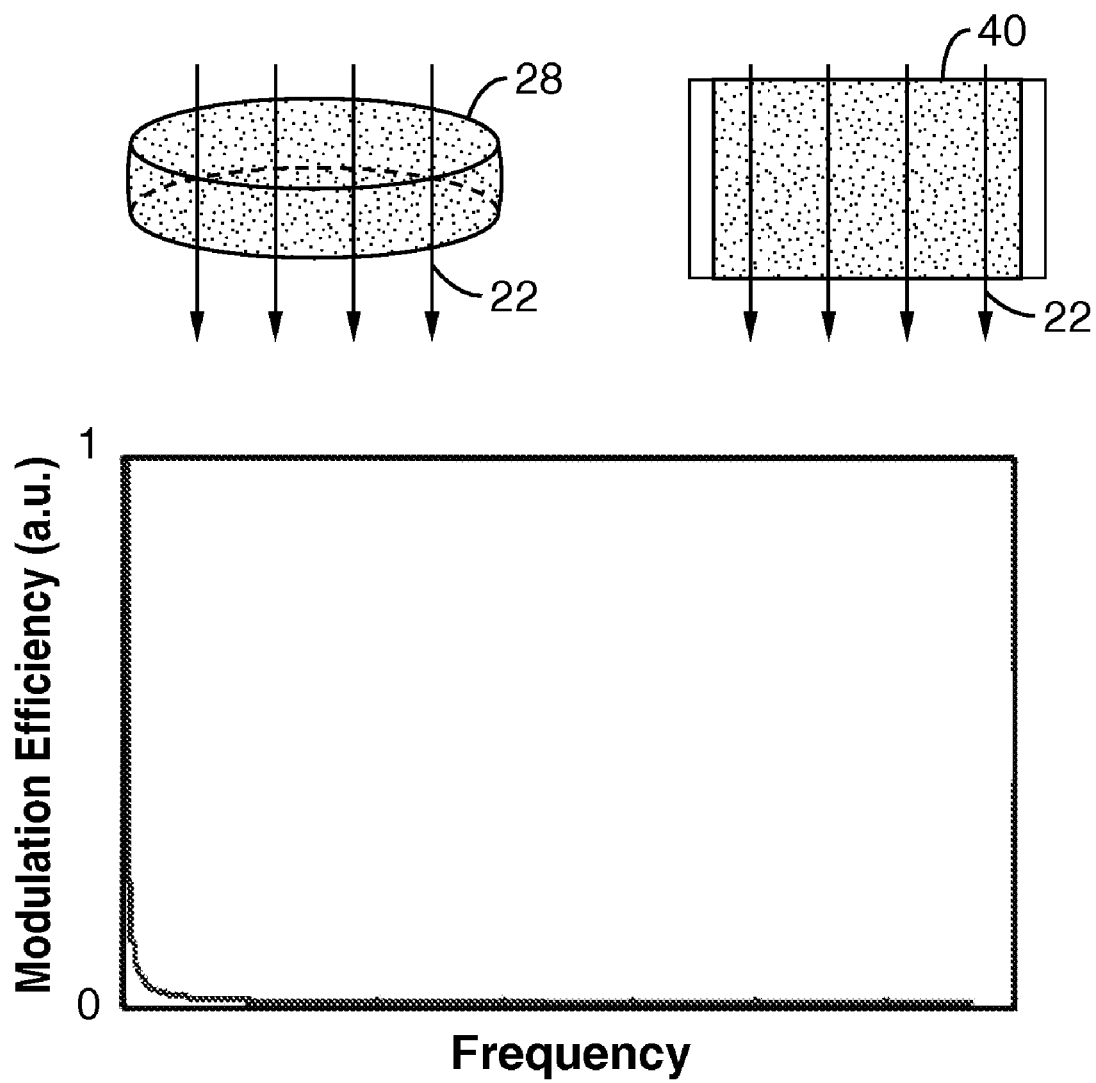
FIG. 10 illustrates how the modulation efficiency at high frequency is improved by breaking the symmetry of the EO resonator and the modulating E-field for a uniform cavity and a field applied uniformly across the entire cavity for a microdisk resonator and Fabry-Perot type resonator according to the present invention.
Figure 11:
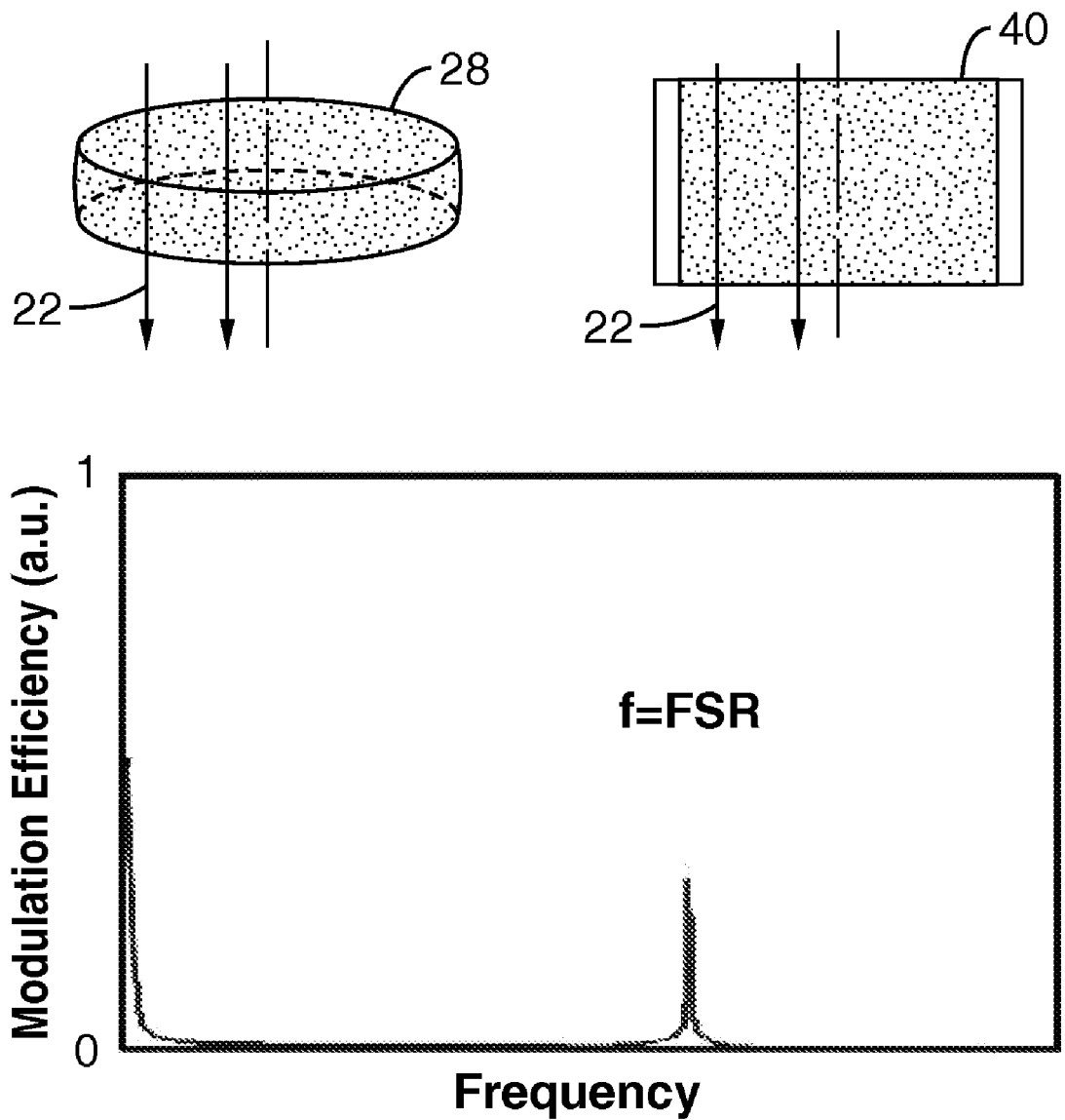
FIG. 11 illustrates how the modulation efficiency at high frequency is improved by breaking the symmetry of the EO resonator and the modulating E-field for a uniform cavity and a field applied across half of the cavity for a microdisk resonator and Fabry-Perot type resonator according to the present invention.
Figures 12, 13:
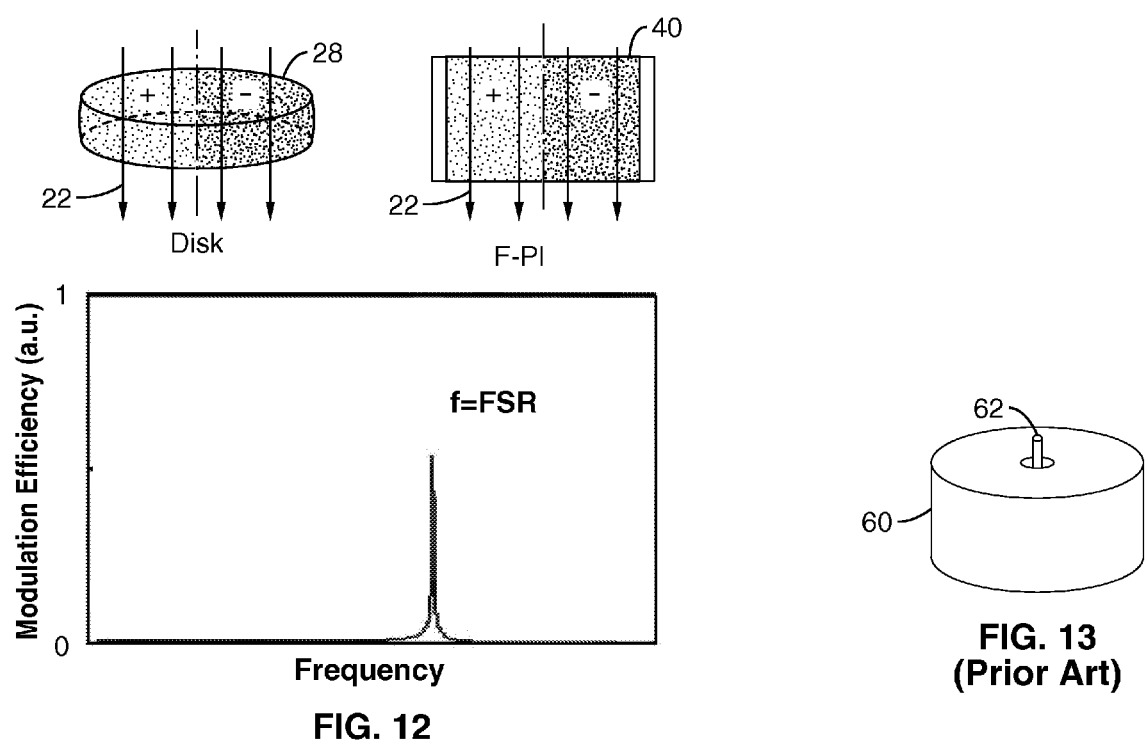
FIG. 12 illustrates how the modulation efficiency at high frequency is improved by breaking the symmetry of the EO resonator and the modulating E-field for a half-domain inverted cavity and a field applied uniformly across the entire cavity for a microdisk resonator and Fabry-Perot type resonator according to the present invention.
FIG. 13 illustrates a Dielectric Resonance Antenna fed by a monopole according to an embodiment of the invention.

As illustrated in FIG. 10 through FIG. 12, in one innovative embodiment, we break the symmetry by applying reverse poling (also known as domain inversion) in half of the ferroelectric EO crystal microdisk or F-P resonator (e.g., z-cut lithium niobate). The result is reversal of the relative signs of the EO coefficient ($r_{33}$) in two halves of the resonator cavity. Domain inversion can be done by using patterned electrodes and by applying a large electric field along the z-axis of the crystal, exceeding the so-called coercive field Ec, a defined electrode pattern can be transferred into a corresponding domain pattern (refer to, for example, M. Yamada, N. Nada, M. Saito, and K. Watanabe, "First-order quasi-phase matched LiNbO3 waveguide periodically poled by applying an external field for efficient blue second-harmonic generation", Appl. Phys Lett. Vol. 62, no. 2, pp. 435-436, 1993, incorporated herein by reference in its entirety).

By way of further example, FIG. 10 shows the modulation response when the E-field is uniformly applied through out the resonance cavity. As can be seen, no high frequency modulation is observable in this case. FIG. 11 and FIG. 12 illustrate how the resulting symmetry removal generates efficient modulation response at higher frequencies ($f_m$=FSR). As illustrated in FIG. 11, when the EO crystal is uniform, applying the E-field to half of the cavity gives the optimal response (sensitivity). As illustrated in FIG. 12, if half of the cavity is domain inverted along the z-axis, the frequency response is doubled compared to the case in FIG. 11.

6. RF Resonance: Dielectric Resonance Antenna

Efficient coupling of RF power to the optical resonator is necessary to achieve high receive sensitivity. In prior conventional approaches, patterned metal electrodes are used to directly couple the RF electric fields to the disk. As explained previously, in the present invention we eliminate the metal antenna and electrodes by using a dielectric resonant antenna (DRA) 14 to couple the electric field to the EO resonator 12 (microdisk or F-P). As shown schematically in FIG. 2, this is accomplished by integrating the high-Q optical resonator with the DRA and using it to sample the concentrated electric field created by the DRA.

DRAs have received reasonable attention for the last few years due to their high radiation efficiency, compact sizes, and relatively large bandwidth (see, for example, A. Petosa, A. Ittipiboon, Y. M. M. Antar, D. Roscoe, and M. Cuhaci, "Recent advances in dielectric resonator antenna technology," IEEE Trans. Antennas Propagat., vol. 40, pp. 235-48, Jun. 1998, incorporated herein by reference in its entirety, and R. K. Mongia, A. Ittipibon and M. Cuhaci, "Measurement of radiation efficiency of dielectric resonator antennas," IEEE Microwave Guided Wave Letters, vol. 4, no. 3, pp. 80-82, March 1994, incorporated herein by reference in its entirety). DRAs are fabricated from materials with low loss and high relative permittivity. Historically, dielectric resonators have been generally used as microwave filters and oscillators packaged in conducting boxes. When placed in an open space, a dielectric resonator can also act as a radiator and, therefore, can be used as an antenna. A displacement current standing-wave pattern can be generated inside the DRA when the resonance mode is properly excited. This displacement current will produce electromagnetic radiation. The same principle applies when the DRA works in the receiving mode. When the incoming radiation matches the resonance mode of DRA, a significant amount of energy can be concentrated and stored in the dielectric, leading to a high field build-up in the vicinity of the structure. FIG. 13 schematically shows a DRA 60 fed by a monopole 62.

Figure 14:
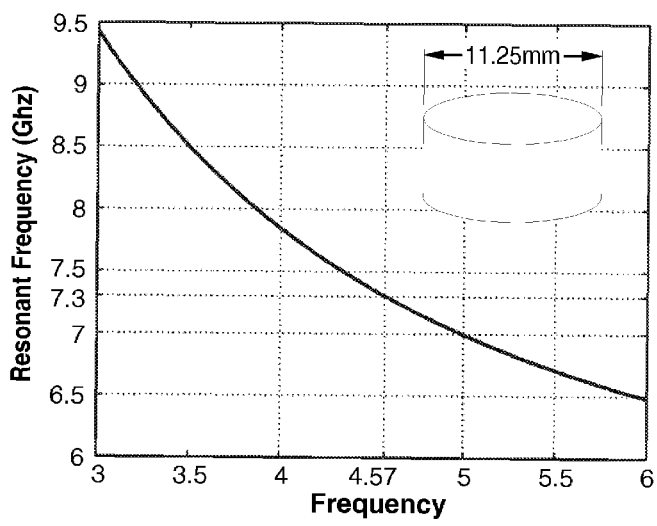
FIG. 14 illustrates the resonance frequency of $TM_{01\delta}$ mode in a cylindrical DRA.

Design of DRAs requires the knowledge of the resonant frequencies, quality factor, mode distribution inside the dielectric structure, and radiation pattern. Antenna geometry and the dielectric material are design parameters that must be selected for each application. Electromagnetic simulation of DRAs allows the optimization of antenna performance by computing the interaction of the electromagnetic wave with the dielectric material and antenna geometry. The outcomes of the simulations are the field distribution inside the DRA, the qualify factor due to radiation loss, near field and far field patterns. By way of example, the well-known High Frequency Structural Simulator (HFSS) can be used for these simulations. The objective is to design for a resonance frequency that matches the FSR of the integrated EO resonator, and to arrive at the electric field pattern and optimum location of the EO resonator within the dielectric resonance antenna that maximizes the EO modulation efficiency. Cylindrical shape DRA is one of the most commonly used geometry because of its ease of numerical analysis. FIG. 14 shows the resonance frequency of the $TM_{01}$ mode in a cylindrical DRA for different heights. By changing the dimension of the DRA, we can precisely control the resonance frequency of DRA. Since some of the high dielectric constant materials tend to be hard and brittle, mechanical polishing is a good way to precisely fabricate the DRA to the desired dimension.

7. Integration

Figure 15:
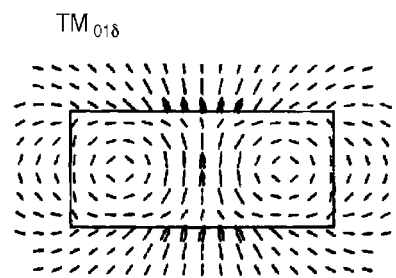
FIG. 15 illustrates the electric field pattern associated with the $TM_{01\delta}$ mode in a cylindrical DRA.

In order to reach optimal sensitivity, the EO resonator sub-assembly needs to be placed at a location where the E-field build-up is the greatest. Referring to FIG. 15, a cylindrical DRA operating in $TM_{01\delta}$ mode is shown by way of example. However, the actual shape of the DRA may be different. FIG. 15 shows that the maximum E-field of $TM_{01\delta}$ mode is located along the center axis. The sensitivity is optimal if the EO resonator sub-assembly is placed in these positions.

Figure 16:
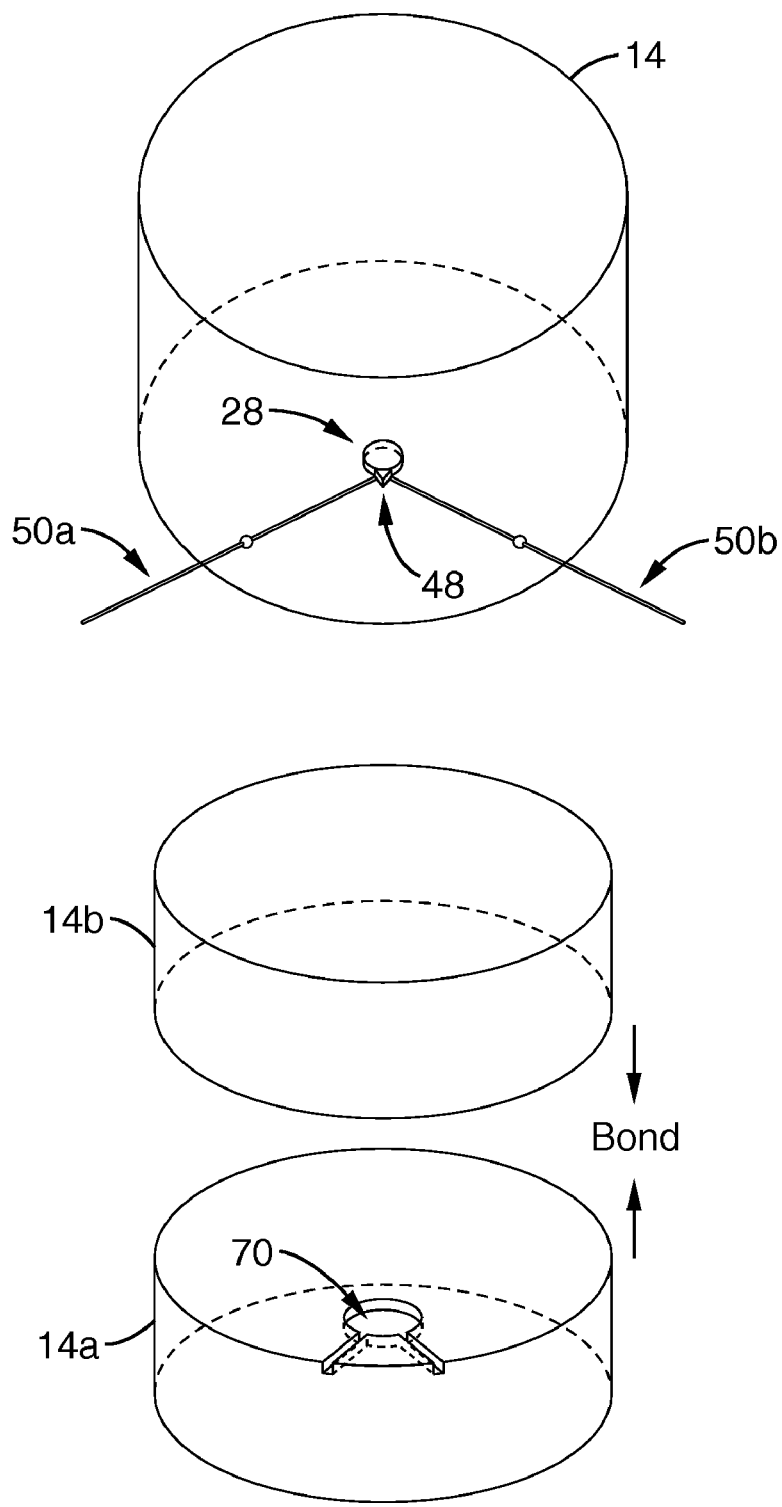
FIG. 16 is a schematic flow diagram showing an embodiment of integration steps of a DRA combined with a EO microdisk resonator according to the invention.
Figure 17:
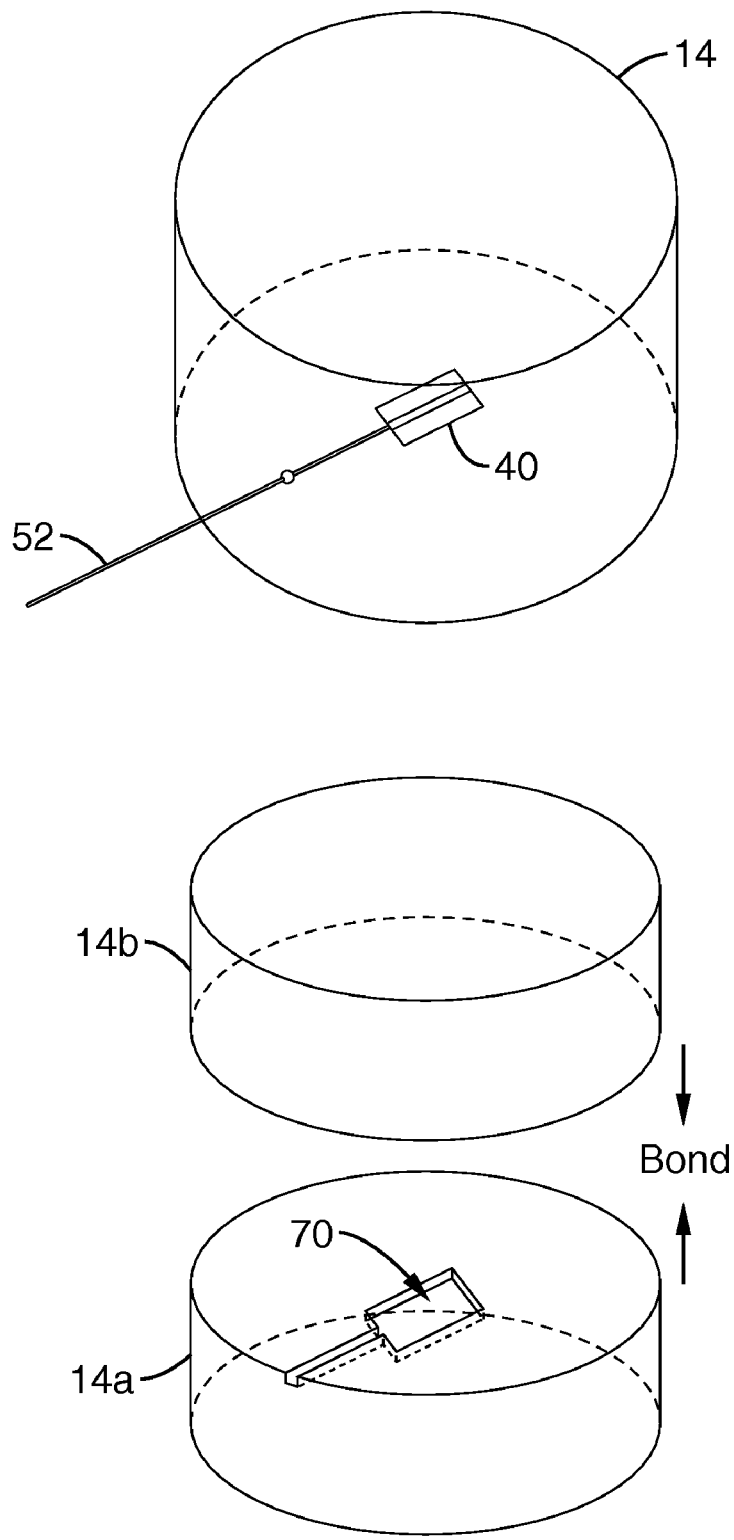
FIG. 17 is a schematic flow diagram showing an embodiment of integration steps of a DRA combined with a Fabry-Perot type resonator according to the invention.

Referring to FIG. 16 and FIG. 17, in one embodiment, the DRA 14 is fabricated in two segments 14a, 14b with the boundary being defined by the proper position of the EO resonator 28 in the DRA. One segment 14a includes a recess or cavity 70 for inserting the EO resonator sub-assembly. The optical subassembly (including, for example, EO microdisk resonator+prism+fibers as illustrated in FIG. 16 or the EO F-P resonator+fiber as illustrated in FIG. 17) is inserted into the matching cavity 70 in segment 14a of the DRA, and the two segments 14a, 14b are bonded together using epoxy or other bonding technique to complete the assembly. In this way, the EO resonator assembly is embedded in the DRA. In another embodiment, the EO resonator sub-assembly is placed on top of the DRA instead of being embedded in the DRA. In this way, the EO resonator assembly is only placed in close vicinity of DRA. Accordingly, the EO resonator is integrated with the DRA. As can be seen from FIG. 15, the E-field is not exclusively confined to only inside the DRA structure. It is also possible for a strong E-field to penetrate out of the DRA structure. Since the E-field strength eventually decays outside the DRA structure, the EO subassembly should be placed as closely to the DRA boundary as possible while still leaving an air gap between the DRA and the EO resonator (e.g., see FIGS. 18 and 19, as well as the discussion below).

Figure 18:
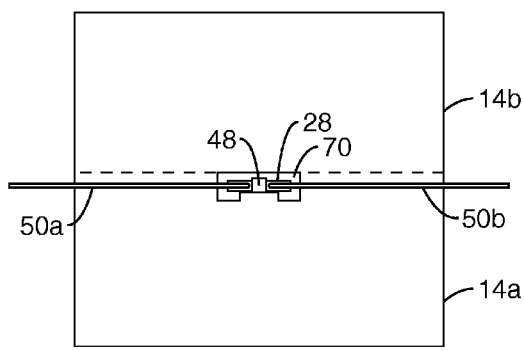
FIG. 18 is a schematic partial cutaway view of a DRA integrated with an EO microdisk resonator according to the present invention showing an air gap between the periphery of the EO resonator and the inside walls of the cavity in the DRA.
Figure 19:
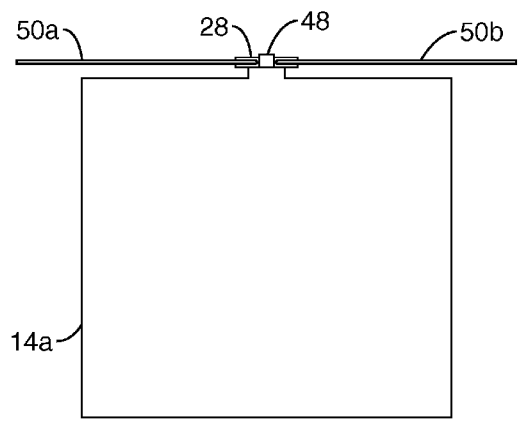
FIG. 19 is a schematic partial cutaway view of a segment of the DRA shown in FIG. 18.

Referring to FIG. 3 and the previous discussion, the optical field in a WGM is primarily located along the periphery 32 of the EO disk resonator 28. In order to achieve high-Q WGM oscillation, the refractive index inside the EO resonator should be significantly larger than that of the medium surrounds it. Therefore, in the preferred embodiment, the sidewalls of the EO resonator are not placed in direct contact with the DRA material. Instead, an air gap is left between the edge of the disk 28 and the surrounding walls of the cavity 70 in the DRA, as shown in FIG. 18 and FIG. 19. Only a thin air gap is needed because most of the optical field is confined within the disk resonator when sufficient index difference is present (n=1 in air and n=2.2 in lithium niobate). Note that the air gap will not impact the performance of DRA since its dimension is almost negligible when compared to the RF wavelength. Only the rim of the crystal needs to be suspended in the air because the WGM mode field is primarily located at the rim. The EO resonator can still be supported by the DRA on the bottom center as illustrated.

8. Broadband Channelization

Figure 20:
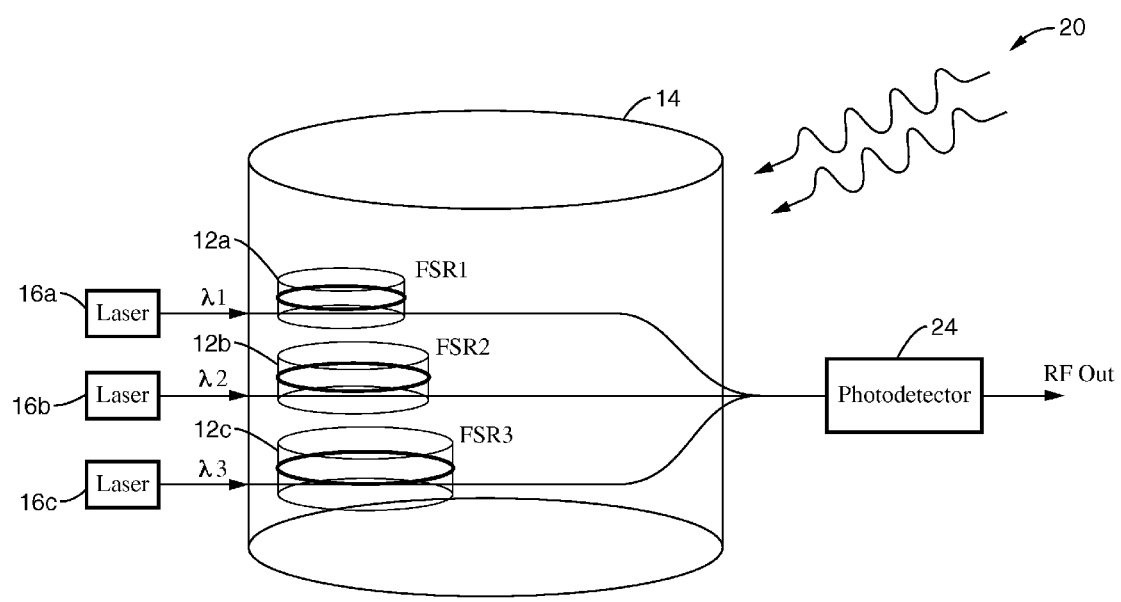
FIG. 20 is a schematic diagram of a multi-band NEAD receiver according to the present invention.

From the foregoing discussion, it will be appreciated that RF modulation generates sidebands around the optical frequency, $f_o$. These frequency sidebands also need to be located inside the optical resonance in order to achieve efficient modulation (e.g., RF to optical conversion). Therefore, only RF modulation frequencies at integral multiples of the optical FSR of the resonator are able to efficiently modulate the optical carrier. While this requirement may limit the system to narrow band RF operation, a broadband system is contemplated through RF channelization. As illustrated in FIG. 20, such a receiver can be created by incorporating an array of resonators of different sizes each with a different FSR corresponding to a specific RF frequency band of interest. Also, as illustrated in FIG. 20, an array of lasers at different wavelengths can be used to address different channels.

As can be seen from the foregoing discussion, the present invention provides a technology that allows for immunity to high power electromagnetic pulse attack. It will be appreciated that the invention provides a number of novel features which include, but are not limited to, the following:

1. Combining a dielectric resonance antenna with an electro-optic sensor.

2. Use of an electro-optic sensor combined with a dielectric resonance antenna to create an RF receiver front end without the use of a metal antenna or metal interconnects.

3. Use of an electro-optic sensor integrated with a dielectric resonance antenna to create an RF receiver front end that contains no electronic components or circuitry after the antenna.

4. An electro-optic field sensor that uses a spatially asymmetric EO resonator.

5. Use of RF to optical conversion to effect electrical isolation between receiver electronics and air interface.

6. Use of the technology to mitigate damage from high power electromagnetic pulses.

7. Use of the dielectric resonance antenna to reduce the radar cross section and hence to improve stealth performance of an RF receiver.

8. Use of a high permittivity material for reducing the antenna aperture size for applications related to EMP and HPM immune receivers.

9. Use of the technology as a EMP and HPM immune field probe.

10. Use of the technology as a remote RF sensor.

11. A method for forming a network of said receivers by multiplexing multiple devices using optical wavelength division multiplexing (WDM).

12. Method for creating a field probe by an electro-optic resonator that lacks azimuthal symmetry.

13. Use of reverse poling of the EO resonator to break its azimuthal symmetry and to maximize the RF to optical conversion efficiency.

14. An electro-optic field sensor front-end that is a passive device with no electrical power required.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus, comprising:
a dielectric resonance antenna configured to operate as a concentrator for the received radio-frequency power; and
an electro-optic resonant modulator integrated with said dielectric resonance antenna;
wherein said electro-optic resonant modulator is configured for receiving radio-frequency power from said dielectric resonance antenna through Pockels effect; and
wherein both said electro-optic resonant modulator and said dielectric resonance antenna are non-electronic structures comprising all-dielectric materials without either metal electrodes or metal transmission lines.

2. An apparatus as recited in claim 1, wherein said electro-optic resonant modulator comprises a microdisk resonator.

3. An apparatus as recited in claim 2, wherein said microdisk resonator comprises a crystal material selected from the group consisting of lithium niobate (LiNbO$_3$) and lithium tantalite (LiTiO$_3$).

4. An apparatus as recited in claim 2, wherein said microdisk resonator has a curved sidewall, a radius of approximately 1 mm, and a thickness of approximately 200 micron.

5. An apparatus as recited in claim 1, wherein said resonator comprises a Fabry-Perot resonator.

6. An apparatus as recited in claim 5, wherein said resonator comprises a crystal material selected from the group consisting of lithium niobate (LiNbO$_3$) and lithium tantalite (LiTiO$_3$).

7. An apparatus as recited in claim 1, further comprising means for reverse poling to break symmetry of resonance in half of the electro-optic resonant modulator.

8. An apparatus as recited in claim 1:
wherein said dielectric resonance antenna includes a cavity;
wherein said electro-optic resonant modulator is positioned in said cavity; and
wherein said electro-optic resonant modulator has a sidewall spaced apart from said dielectric resonance antenna by an air gap.

9. An apparatus as recited in claim 8, wherein said dielectric resonance antenna comprises:
a first segment having said cavity; and
a second segment bonded to said first segment.

10. An apparatus as recited in claim 1, further comprising:
a prism optically coupled to said electro-optic resonant modulator;
an input fiber optically coupled to said prism; and
an output fiber optically coupled to said prism.

11. An apparatus as recited in claim 10, wherein said prism, said input fiber and said output fiber are integrated with said dielectric resonance antenna.

12. An apparatus as recited in claim 1, wherein said apparatus is an unpowered passive device.

13. An apparatus as recited in claim 1, wherein said apparatus provides a high degree of immunity from damage to interconnected devices from high power electromagnetic pulses (EMP).

14. An apparatus as recited in claim 1, wherein said apparatus is a component of a device selected from the group consisting of a non-intrusive field sensor that does not require a metal antenna, metal interconnects, or metal electrodes, a radio frequency receiver front-end that does not require a metal antenna, metal interconnects, or metal electrodes, a high-altitude nuclear electromagnetic pulse immune field probe, and a remote radio frequency sensor.

15. An apparatus, comprising:
a dielectric resonance antenna; and
an electro-optic resonator;
said dielectric resonance antenna comprising a first segment and a second segment bonded to said first segment;
said first segment of said dielectric resonance antenna having a cavity;
said resonator positioned in said cavity;
said resonator having a sidewall spaced apart from said dielectric resonance antenna by an air gap.

16. An apparatus as recited in claim 15:
wherein said resonator comprises a microdisk resonator; and
wherein said microdisk resonator comprises a crystal material selected from the group consisting of lithium niobate (LiNbO$_3$) and lithium tantalite (LiTiO$_3$).

17. An apparatus as recited in claim 16, wherein said microdisk resonator has a curved sidewall, a radius of approximately 1 mm, and a thickness of approximately 200 micron.

18. An apparatus as recited in claim 15:
wherein said resonator comprises a Fabry-Perot resonator; and
wherein said Fabry-Perot resonator comprises a crystal material selected from the group consisting of lithium niobate (LiNbO$_3$) and lithium tantalite (LiTiO$_3$).

19. An apparatus as recited in claim 15, wherein reverse poling is used to break symmetry of said resonator.

20. An apparatus as recited in claim 15, further comprising:
a prism optically coupled to said resonator;
an input fiber optically coupled to said prism; and
an output fiber optically coupled to said prism.

21. An apparatus as recited in claim 20, wherein said prism, said input fiber and said output fiber are integrated with the said dielectric resonance antenna.

22. An apparatus as recited in claim 15, wherein said apparatus is an unpowered passive device.

23. An apparatus as recited in claim 15, wherein said apparatus provides a high degree of immunity from damage to interconnected devices from high power electromagnetic pulses (EMP).

24. An apparatus as recited in claim 15, wherein said apparatus is a component of a device selected from the group consisting of a non-intrusive field sensor that does not require a metal antenna, metal interconnects, or metal electrodes, a radio frequency receiver front-end that does not require a metal antenna, metal interconnects, or metal electrodes, a high-altitude nuclear electromagnetic pulse immune field probe, and a remote radio frequency sensor.

25. An apparatus, comprising:
a dielectric resonance antenna; and
an electro-optic crystal resonator;
said dielectric resonance antenna comprising a first segment and a second segment bonded to said first segment;
said first segment of said dielectric resonance antenna having a cavity;
said resonator positioned in said cavity;
said resonator having a sidewall spaced apart from said dielectric resonance antenna by an air gap.

26. An apparatus as recited in claim 25, wherein said resonator comprises a microdisk resonator.

27. An apparatus as recited in claim 25, wherein said microdisk resonator has a curved sidewall, a radius of approximately 1 mm, and a thickness of approximately 200 micron.

28. An apparatus as recited in claim 25, wherein said resonator comprises a Fabry-Perot resonator.

29. An apparatus as recited in claim 25, wherein said resonator comprises a crystal material selected from the group consisting of lithium niobate ($LiNbO_3$) and lithium tantalite ($LiTiO_3$).

30. An apparatus as recited in claim 25, wherein reverse poling is used to break symmetry of said resonator.

31. An apparatus as recited in claim 25, further comprising:
a prism optically coupled to said resonator;
an input fiber optically coupled to said prism; and
an output fiber optically coupled to said prism;
wherein said resonator, said prism, said input fiber, and said output fiber are integrated with said dielectric resonance antenna.

32. An apparatus as recited in claim 25, wherein said apparatus is an unpowered passive device.

33. An apparatus as recited in claim 25, wherein said apparatus provides a high degree of immunity from damage to interconnected devices from high power electromagnetic pulses (EMP).

34. An apparatus as recited in claim 25, wherein said apparatus is a component of a device selected from the group consisting of a non-intrusive field sensor that does not require a metal antenna, metal interconnects, or metal electrodes, a radio frequency receiver front-end that does not require a metal antenna, metal interconnects, or metal electrodes, a high-altitude nuclear electromagnetic pulse immune field probe, and a remote radio frequency sensor.

* * * * *